(12) United States Patent
Matsui (10) Patent No.: US 11,381,196 B2
(45) Date of Patent: Jul. 5, 2022

(54) STAGE DRIVING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Takayasu Matsui, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 730 days.

(21) Appl. No.: 16/353,235

(22) Filed: Mar. 14, 2019

(65) Prior Publication Data

US 2019/0288633 A1    Sep. 19, 2019

(30) Foreign Application Priority Data

Mar. 16, 2018   (JP) .............................. JP2018-049909

(51) Int. Cl.
*H02P 29/62* (2016.01)
*H01L 21/027* (2006.01)
(Continued)

(52) U.S. Cl.
CPC ............ *H02P 29/62* (2016.02); *G03F 7/0002* (2013.01); *G03F 7/70725* (2013.01); *G03F 7/70758* (2013.01); *G03F 7/70858* (2013.01); *H01L 21/0271* (2013.01); *H01L 21/67103* (2013.01); *H01L 21/68* (2013.01); *H02K 15/125* (2013.01); *H02K 41/031* (2013.01); *H02P 25/064* (2016.02); *H02K 11/25* (2016.01)

(58) Field of Classification Search
None
See application file for complete search history.

(56) References Cited

U.S. PATENT DOCUMENTS 5,973,459 A   10/1999   Itoh
5,998,889 A   12/1999   Novak
(Continued)

FOREIGN PATENT DOCUMENTS

CN   107487696 A   12/2017
JP   2001119918 A   4/2001
(Continued)

OTHER PUBLICATIONS

Extended European Search Report issued in European Appln. No. 19161044.3 dated Aug. 21, 2019.
(Continued)

*Primary Examiner* — Robert J Grun
(74) *Attorney, Agent, or Firm* — Rossi, Kimms & McDowell LLP (57) ABSTRACT

The present invention provides a stage driving apparatus for driving a stage, comprising: a linear motor including a stator which includes a coil array obtained by alternately arraying first phase coils and second phase coils, and a movable element placed on the stage; and a control unit configured to control the linear motor by controlling an energization state of the coil array, wherein in a stopping period during which the stage is stopped in a predetermined position, the control unit holds a position of the stage in the predetermined position by turning on the first phase coil among the coil array, and generates heat by turning on the second phase coil arranged in a position where no thrust is given to the movable element among the coil array.

12 Claims, 7 Drawing Sheets

(51) Int. Cl.
  *H01L 21/67* (2006.01)
  *H01L 21/68* (2006.01)
  *H02P 25/064* (2016.01)
  *G03F 7/00* (2006.01)
  *G03F 7/20* (2006.01)
  *H02K 15/12* (2006.01)
  *H02K 41/03* (2006.01)
  *H02K 11/25* (2016.01)

(56) References Cited

U.S. PATENT DOCUMENTS

| | | | |
|---|---|---|---|
| 6,590,355 | B1 | 7/2003 | Kikuchi |
| 7,557,469 | B2 | 7/2009 | Emoto |
| 10,384,913 | B2 | 8/2019 | Schmidt |
| 2004/0061385 | A1 | 4/2004 | Sato |
| 2010/0194328 | A1 | 8/2010 | Widdowson |
| 2015/0338750 | A1 | 11/2015 | Yang |
| 2016/0005568 | A1 | 1/2016 | Mizuochi |
| 2017/0111002 | A1 | 4/2017 | Hemati |

FOREIGN PATENT DOCUMENTS

| | | |
|---|---|---|
| JP | 3501559 B2 | 3/2004 |
| JP | 2004111684 A | 4/2004 |
| JP | 2015082559 A | 4/2015 |

OTHER PUBLICATIONS

Office Action issued in Chinese Application No. 201910203479.1 dated Dec. 1, 2020.

STAGE DRIVING APPARATUS, LITHOGRAPHY APPARATUS, AND METHOD OF MANUFACTURING ARTICLE

BACKGROUND OF THE INVENTION

Field of the Invention

The present invention relates to a stage driving apparatus, a lithography apparatus, and a method of manufacturing an article.

Description of the Related Art

Some lithography apparatuses to be used to manufacture semiconductor devices and the like use a multi-phase linear motor for selectively switching coils to be turned on in accordance with the position of a movable element, as a mechanism of driving a stage for holding an original, a substrate, or the like. Japanese Patent No. 3501559 proposes a multi-phase excitation sine-wave driving method using the principle of $\sin^2(x)+\cos^2(x)=1$, as a method of controlling a driving current of a multi-phase linear motor like this. When driving the stage in this multi-phase excitation sine-wave driving method, electric currents equivalent to the magnetic flux densities of two-phase coils positioned apart from each other at a magnetic flux density phase angle of 90° are simultaneously supplied to these coils (that is, two-phase excitation is performed). Consequently, a predetermined thrust can be obtained by reducing the unevenness of thrust.

As micropatterning and integration of semiconductor devices advance, the lithography apparatuses are being required to manage measurement errors of stage positions and shape errors of parts and substrates in the apparatuses, and accurately form patterns on substrates. Therefore, it is desirable to accurately control an internal temperature of an apparatus, which is one cause of these errors, so as to reduce the fluctuation of temperature. However, the heat generated by the linear motor for driving the stage during a stage driving period is largely different from that during a stage stopping period. This may make it difficult to reduce the temperature fluctuation in the apparatus.

SUMMARY OF THE INVENTION

The present invention provides, for example, a technique advantageous in controlling generation of heat from a linear motor.

According to one aspect of the present invention, there is provided a stage driving apparatus for driving a stage, comprising: a linear motor including a stator which includes a coil array obtained by alternately arraying first phase coils and second phase coils, and a movable element placed on the stage; and a control unit configured to control the linear motor by controlling an energization state of the coil array, wherein in a stopping period during which the stage is stopped in a predetermined position, the control unit holds a position of the stage in the predetermined position by turning on the first phase coil among the coil array, and generates heat by turning on the second phase coil arranged in a position where no thrust is given to the movable element among the coil array.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. Also, in the following embodiments, an example in which a stage driving apparatus of the present invention is applied to an exposure apparatus for transferring a mask (original) pattern onto a substrate will be explained. However, the present invention is not limited to this. For example, the stage driving apparatus of the present invention is also applicable to other lithography apparatuses such as an imprint apparatus for forming an imprint material pattern on a substrate by using a mold, and a drawing apparatus for forming a pattern on a substrate by irradiating it with a charged particle beam.

First Embodiment

Figure 1:
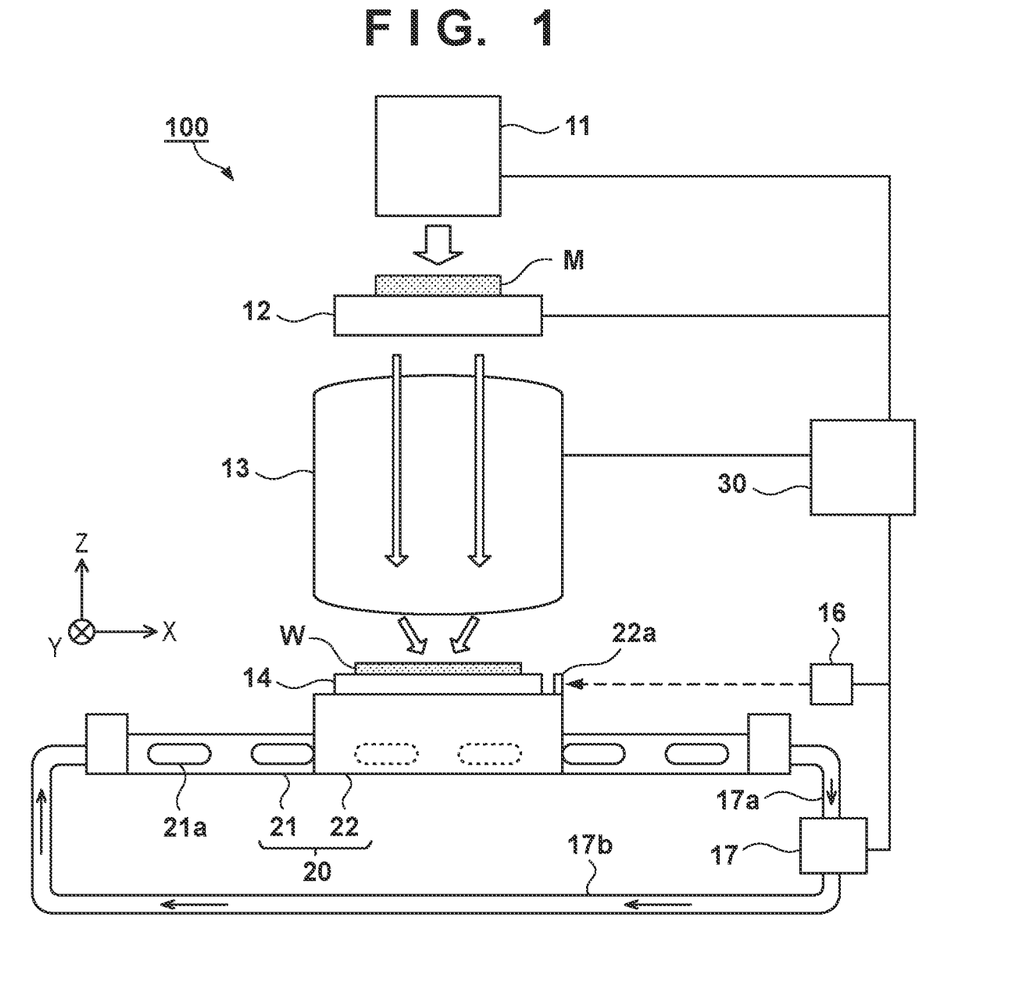
FIG. 1 is a schematic view showing a configuration example of an exposure apparatus.

An exposure apparatus 100 of the first embodiment will be explained with reference to FIG. 1. FIG. 1 is a schematic view showing a configuration example of the exposure apparatus 100 of this embodiment. The exposure apparatus 100 of this embodiment can include an illumination optical system 11, a mask stage 12 for holding a mask M, a projection optical system 13, a substrate stage 14 for holding a substrate W, a linear motor 20 (a driving unit) for driving the substrate stage 14, and a control unit 30. The control unit 30 includes a CPU, a memory, and the like, and controls each unit of the exposure apparatus 100 (controls a process of exposing the substrate W). In this embodiment, a stage driving apparatus for driving the substrate stage 14 can be constructed by the linear motor 20 and the control unit 30.

The illumination optical system 11 illuminates the mask M held by the mask stage 12 by using light emitted from a light source. The projection optical system 13 has a predetermined magnification, and projects a pattern formed on the mask M onto the substrate W. The mask M and the substrate W are respectively held by the mask stage 12 and the substrate stage 14, and arranged in almost optically conjugate positions (the object plane and the image plane of the projection optical system 13) via the projection optical system 13. The mask stage 12 holds the mask M by a vacuum suction force or the like, and can move in, for example, the XY directions. The substrate stage 14 holds the substrate W by a vacuum suction force or the like, and is driven in, for example, the XY directions (the X direction in this configuration example shown in FIG. 1) by the linear motor 20. The linear motor 20 includes a stator 21 including a plurality of coils (a coil array) 21a, and a movable element 22 formed for the substrate stage 14.

The exposure apparatus 100 can further include a measurement device 16 for measuring the position of the substrate stage 14, and a temperature-regulator 17 for regulating the temperature of the stator 21 of the linear motor 20. The measurement device 16 includes a laser interferometer, an encoder, or the like, and measures the present position of the substrate stage 14 (the movable element 22). The measurement device 16 shown in FIG. 1 includes a laser interferometer, irradiates a mirror 22a formed on the substrate stage 14 with a laser beam, and measures the present position of the substrate stage 14 (the movable element 22) by using the laser beam reflected by the mirror 22a. Also, the temperature-regulator 17 can regulates the temperature of the stator 21 by supplying a fluid to a channel formed in the stator 21 of the linear motor 20. The temperature-regulator 17 shown in FIG. 1 recovers the fluid from the channel of the stator 21 via a recovery pipe 17a, and regulates the temperature of the recovered fluid to a target temperature based on the result of detection of the temperature of the fluid by a temperature sensor. Then, the temperature-regulator 17 regulates the temperature of the stator 21 by supplying the temperature-regulated fluid to the channel of the stator 21 via a supply pipe 17b.

Next, the linear motor 20 of this embodiment will be explained. The linear motor 20 of this embodiment includes the plurality of coils 21a obtained by alternately arraying first phase coils and second phase coils in the stator 21, and is configured as a multi-phase linear motor capable of selectively switching the coils 21a to be turned on in accordance with the position of the movable element 22. Also, this embodiment uses a multi-phase excitation sine-wave driving method (to be sometimes simply called "a multi-phase excitation method" hereinafter), as a method of controlling the driving current of the linear motor 20 (i.e. a method controlling an energization state of the coil array 21a). In the linear motor 20 configured as described above, the position of the movable element 22 can be controlled by turning on, for example, a pair of the first phase coil and the second phase coil selected from the plurality of coils 21a in accordance with the position of the movable element 22. In the following explanation, the first phase coil is an A-phase coil, and the second phase coil is a B-phase coil. However, these relationships may also be switched (that is, the first phase coil can be the B-phase coil, and the second phase coil can be the A-phase coil).

Figure 2A:
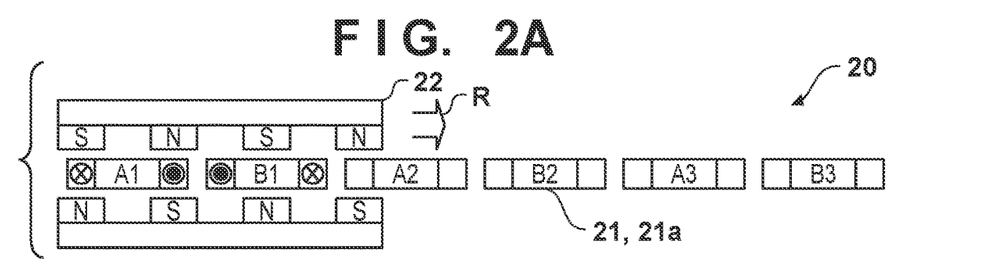
FIGS. 2A to 2F are views for explaining the operation of a multi-phase excitation linear motor.
Figure 2B:
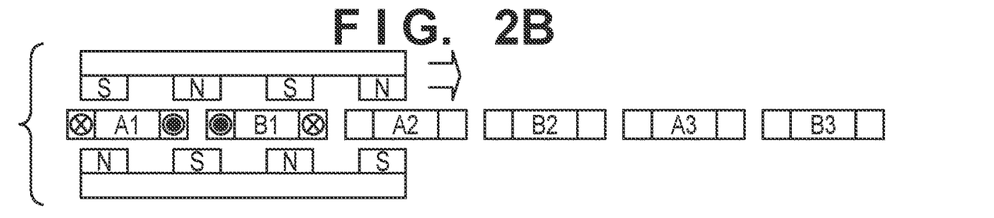
Figure 2C:
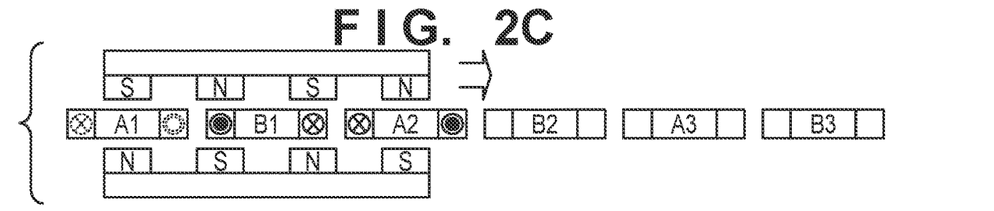
Figure 2D:
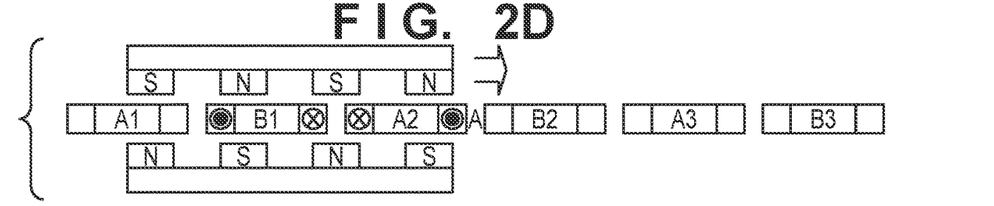
Figure 2E:
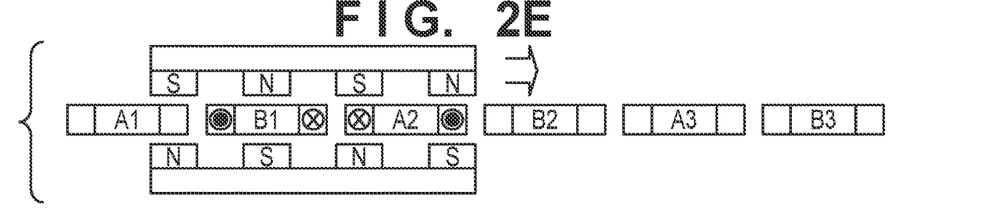

FIGS. 2A to 2F are views for explaining the operation of the multi-phase excitation linear motor 20 according to this embodiment. FIGS. 2A to 2E are views showing the state transition of the linear motor 20 in time series when moving the movable element in the direction of an arrow R. FIGS. 2A to 2E depict the linear motor 20 which includes the stator 21 including the plurality of coils 21a obtained by alternately arraying A-phase coils and B-phase coils, and the movable element 22 including a plurality of magnets. In FIGS. 2A to 2E, of the plurality of coils 21a in the stator 21, the A-phase coils are given numbers A1 to A3, and the B-phase coils are given numbers B1 to B3. In the linear motor 20 having the arrangement as described above, it is possible to continuously give thrust to the movable element 22 and move the movable element 22 by turning on an A-phase coil and a B-phase coil selected based on position information of the movable element 22 measured by the measurement device 16. Referring to FIGS. 2A and 2B, the A-phase coil A1 and the B-phase coil B1 are selected as the coils 21a to be turned on, based on the position information of the movable element 22 measured by the measurement device 16. Referring to FIGS. 2C to 2E, the B-phase coil B1 and the A-phase coil A2 are selected in the same manner.

Figure 2F:
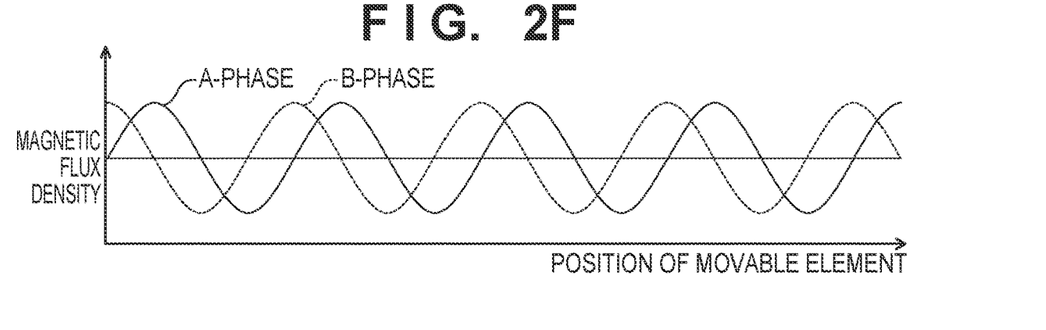

FIG. 2F shows an example of the magnetic flux density distribution representing the state of a magnetic flux density passing through each coil 21a. In FIG. 2F, the abscissa indicates the position of the movable element 22, and the ordinate indicates the magnetic flux density passing through each coil. The magnetic flux density distribution of the A-phase coil is obtained by continuously connecting the magnetic flux densities of A-phase coils selected and turned on in accordance with the position of the movable element 22, among the plurality of A-phase coils. Similarly, the magnetic flux density distribution of the B-phase coil is obtained by continuously connecting the magnetic flux densities of B-phase coils selected and turned on in accordance with the position of the movable element 22, among the plurality of B-phase coils. The magnetic flux density distribution shown in FIG. 2F is an example of moving the movable element 22 in the direction of the arrow R. When actually controlling the position of the movable element 22, the phase and the intensity (amplitude) can change in accordance with the moving velocity of the movable element 22, a thrust to be generated by the linear motor 20, and the like.

Referring to FIGS. 2A to 2F, when driving the movable element 22, an electric current proportional to $\sin(x)$ is supplied to the A-phase coil selected in accordance with the position of the movable element 22, so that the magnetic flux density becomes $\sin(x)$ with respect to a position x of the movable element 22. For the B-phase coil spaced apart from the A-phase coil at a magnetic flux density phase angle of 90°, an electric current proportional to $\cos(x)$ is supplied to the B-phase coil selected in accordance with the position of the movable element 22, so that the magnetic flux density becomes $\cos(x)$. In this manner, a thrust which is determined by the magnetic flux and the electric current in each of the A-phase coil and the B-phase coil has a relationship of $\sin^2(x)+\cos^2(x)=1$, so a predetermined thrust can be generated by reducing the unevenness of thrust.

Figure 3:
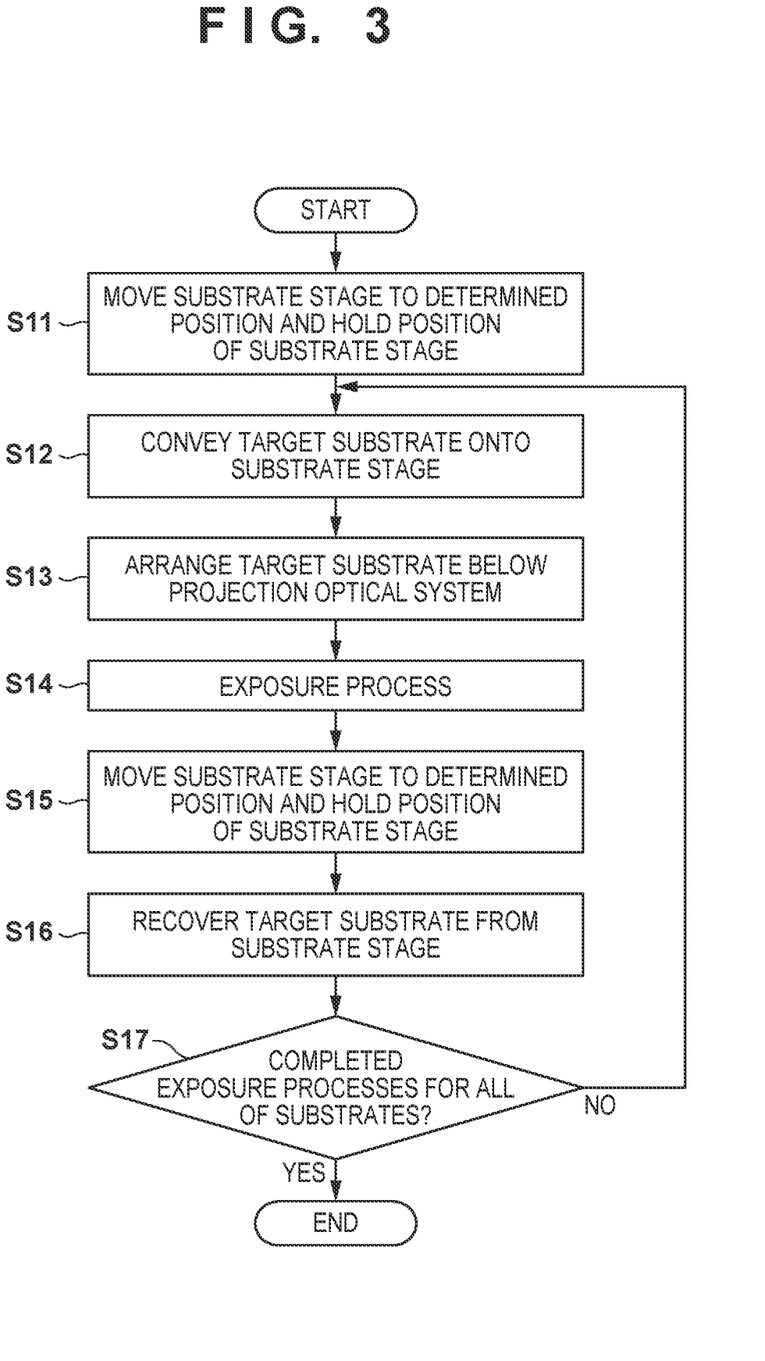
FIG. 3 is a flowchart showing the operation sequence of the exposure apparatus.

The operation sequence of the exposure apparatus 100 will be explained below with reference to FIG. 3. FIG. 3 is a flowchart showing the operation sequence of the exposure apparatus 100. This flowchart of FIG. 3 shows the operation sequence of the exposure apparatus 100 when performing an exposure process on each of a plurality of substrates W included in one lot, and the operation sequence can repetitively be performed while changing lots. Note that the flowchart shown in FIG. 3 explains the movement of the substrate stage 14 (the movable element 22), and a practical explanation of the exposure process will be omitted.

In step S11, the control unit 30 controls the linear motor 20 to move the substrate stage 14 (the movable element 22) to a predetermined position, and hold (maintain) the substrate stage 14 in the predetermined position. In this step, lot replacement (exchange) or the like can be performed. In step S12, the control unit 30 controls a substrate conveying mechanism to convey the substrate W (a target substrate W) as a target of the exposure process, among the plurality of substrates W included in one lot, onto the substrate stage 14, and controls the substrate stage 14 to hold the target substrate W. Steps S11 and S12 are performed before the exposure process is started, and the substrate stage 14 is in a stopping state (idling state).

In step S13, the control unit 30 controls the linear motor 20 to place the target substrate W below the projection optical system 13. In step S14, the control unit 30 repeats the exposure process in each of a plurality of shot regions on the target substrate W while inserting stepped movement. The exposure method in this step can be either a step-and-repeat method or a step-and-scan method. In step S15, the control unit 30 controls the linear motor 20 to move the substrate stage 14 (the movable element 22) to a predetermined position, and hold (maintain) the substrate stage 14 in the predetermined position. In step S16, the control unit 30 controls the substrate conveying mechanism to recover the target substrate W from the substrate stage 14. In step S17, the control unit 30 determines whether the exposure processes for all the substrates W in the lot are completed. If the substrate W for which no exposure process is performed exists, the process returns to step S12. On the other hand, if the exposure processes for all the substrates W are completed, the processing is terminated.

In this operation sequence, in steps in which the substrate stage 14 is frequently moved as in steps S13 to S15, a thrust is generated in the linear motor by turning on the coils 21a of the stator 21, so the stator 21 generates Joule heat. The calorific value is generally the product of the square of the current value supplied to the coil 21a per unit time, and the DC resistance of the coil 21a. In recent exposure apparatuses, the acceleration of the substrate stage 14 is increasing in order to achieve a high productivity, and repetitive driving at this high acceleration may increase the calorific value of the stator 21 to about a few hundred W. On the other hand, in a period after the exposure processes for all the substrates W in the lot are completed and before exposure processes for substrates W in the next lot are started as in steps S11 and S12, the substrate stage 14 is in the stopping state (idling state). In this case, the linear motor 20 need only generate a force of maintaining the stopping state. Therefore, the current value to be supplied to the coil 21a becomes very small (nearly zero) compared to that when moving the substrate stage 14.

Figure 4:
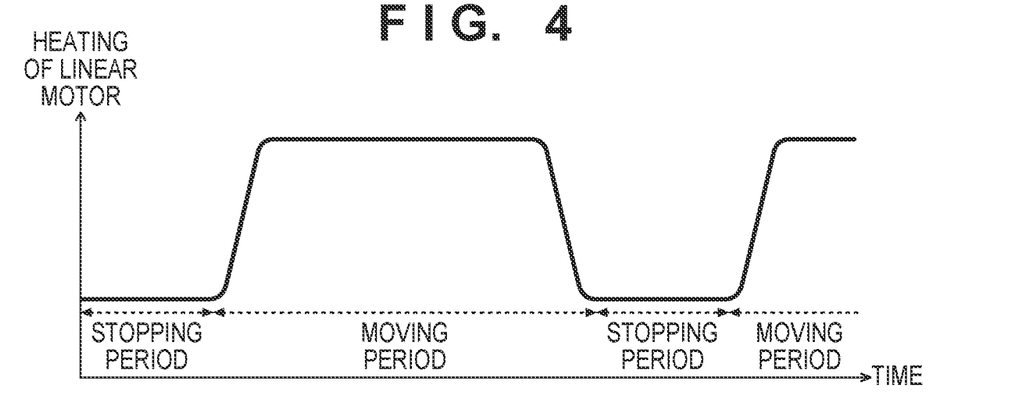
FIG. 4 is a graph showing the relationship between the operation of the exposure apparatus and the heat generation of the linear motor.

FIG. 4 is a graph showing the relationship between the operation of the exposure apparatus 100 and heat generation (the calorific value per unit time) of the linear motor 20. In the exposure apparatus 100 as shown in FIG. 4, the heat generation of the linear motor 20 in a stopping period during which the substrate stage 14 is stopped in a predetermined position is largely different from that in a period during which the exposure process is performed, that is, in a moving period during which the movement frequency of the substrate stage 14 is high. (The moving period can also be regarded as a period during which the position of the substrate stage 14 is controlled in a position different from a predetermined position.) When the heat generation of the linear motor 20 thus fluctuates, the internal temperature of the apparatus also fluctuates accordingly. As a consequence, the measurement error of the position of the substrate stage 14 and the shape errors of components, substrates, and the like in the apparatus change, and this makes it difficult to accurately transfer a pattern onto a substrate. Also, even when the temperature-regulator 17 for regulating the temperature of the stator 21 is installed, a temperature-regulation control delay sometimes occurs when changing (switching) the stopping period and the moving period.

In the exposure apparatus 100, therefore, it is preferable to control current supply to each coil 21a of the stator 21 in the stopping period, so that the heat generation of the linear motor 20 in the stopping period approaches that of the linear motor 20 in the moving period. In the multi-phase excitation method described above, it is possible to generate thrusts in opposite directions in the A-phase coil and the B-phase coil in the stopping period, so that the position of the substrate stage 14 is held and the heat generation of the linear motor approaches that in the moving period. In this case, however, the thrusts generated in the A-phase coil and the B-phase coil may apply an unintended stress to the substrate stage 14, and cause strain deformation on the substrate stage 14 and the substrate W.

In the stopping period of this embodiment, therefore, the position of the substrate stage 14 is held by turning on the first phase coil, and the second phase coil arranged in a position where no thrust is given to the movable element 22 is turned on. That is, the linear motor 20 is controlled such that the first phase coil controls holding of the position of the substrate stage 14, and the second phase coil controls the heat generation of the linear motor 20. When using the multi-phase excitation method, therefore, it is possible to reduce the heat generation fluctuation of the linear motor 20 and the unintended stress to the substrate stage 14. As described previously, the first phase coil is one of the A-phase coil and the B-phase coil, and the second phase coil is the other one of the A-phase coil and the B-phase coil.

Figure 5:
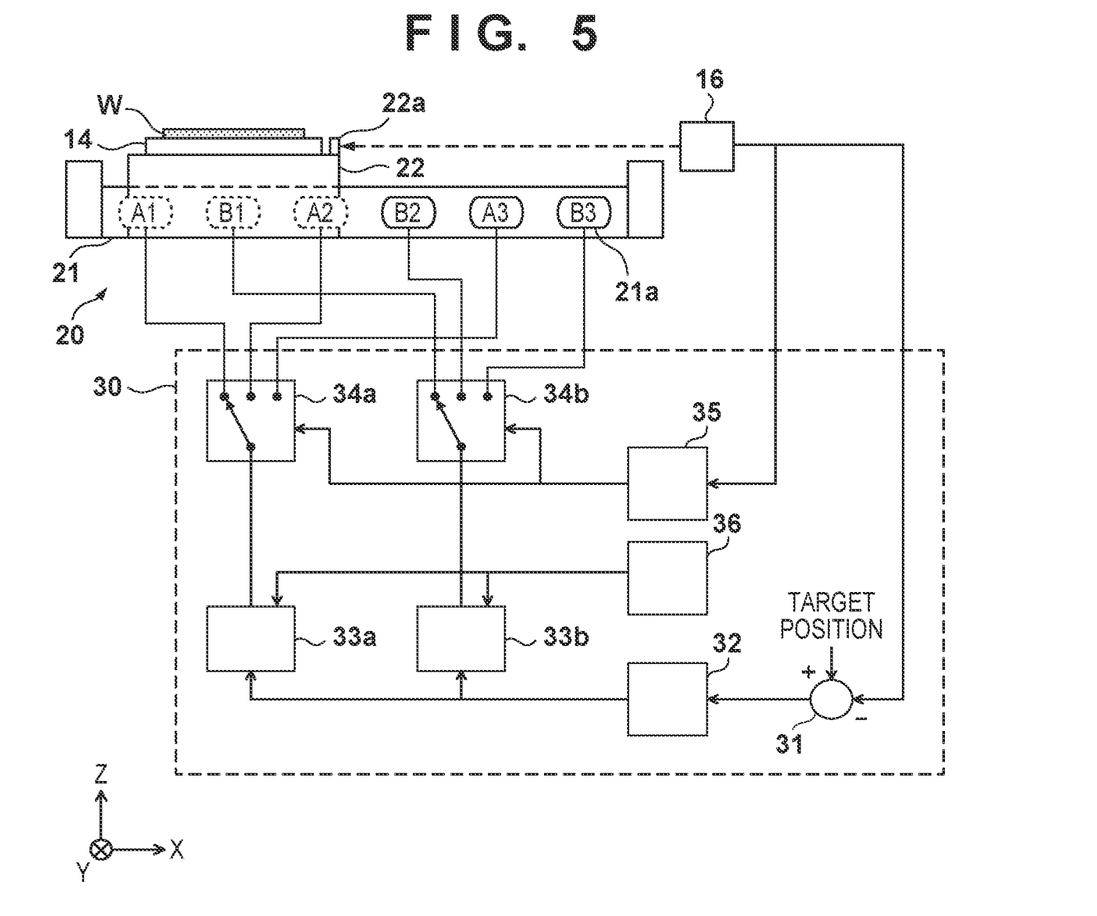
FIG. 5 is a view showing a configuration example of a stage driving apparatus of the first embodiment.

FIG. 5 is a view showing a configuration example of a stage driving apparatus of this embodiment. This stage driving apparatus shown in FIG. 5 includes the substrate stage 14 for holding the substrate W, the linear motor 20 for driving the substrate stage 14, the measurement device 16 (a laser interferometer) for measuring the position of the substrate stage 14, and the control unit 30. The stator 21 of the linear motor 20 includes a plurality of coils obtained by alternately arraying A-phase coils and B-phase coils. To simplify the drawing, this example shown in FIG. 5 depicts three A-phase coils A1 to A3 and three B-phase coils B1 to B3. However, the number of the A-phase coils or the B-phase coils is not limited to three, and may also be four or more. The control unit 30 can include, for example, a subtractor 31, a position compensator 32, current drivers 33a and 33b, switching units 34a and 34b, a selector 35, and a temperature compensator 36.

The subtractor 31 calculates a deviation between the present position of the movable element 22 measured by the measurement device 16 and a target position, and supplies the calculated deviation information to the position compensator 32. The position compensator 32 is a PID compensator or the like, and, based on the deviation information from the subtractor 31, determines a command value for driving the substrate stage 14 (the movable element 22) so that the deviation falls within an allowable range (for example, so that the deviation becomes zero). The current driver 33a outputs an electric current to be supplied to the A-phase coil, based on the command value from the position compensator 32. The current driver 33b outputs an electric current to be supplied to the B-phase coil, based on the command value from the position compensator 32. The current drivers 33a and 33b output the electric currents such that the electric current to be supplied to the A-phase coil and the electric current to be supplied to the B-phase coil have a phase angle difference of 90°.

The switching unit 34a switches the A-phase coils to which the current driver 33a supplies the electric current, based on a signal from the selector 35. The switching unit 34b switches the B-phase coils to which the current driver 33b supplies the electric current, based on a signal from the selector 35. The switching units 34a and 34b can mechanically switch the current supply destinations, and can also switch them by software. The selector 35 selects a pair of the A-phase coil and the B-phase coil to be turned on, from the plurality of coils 21a based on the present position of the movable element 22 measured by the measurement device 16. Then, the selector 35 controls the switching units 34a and 34b so as to switch the current supply destinations to the selected A-phase coil and B-phase coil.

As control modes for controlling the linear motor 20, the selector 35 can include a stopping mode (first mode) for holding the position of the substrate stage 14 in a predetermined position, and a moving mode (second mode) for controlling the position of the substrate stage 14 in a position different from the predetermined position. For example, the moving mode is applied during the exposure process as shown in step S14 of FIG. 3. In the moving mode, the selector 35 selects a pair of (for example, one for each of) the A-phase coil and the B-phase coil to be turned on so as to move the substrate stage 14 by giving thrust to the movable element 22, based on the present position of the movable element 22 measured by the measurement device 16. Then, the selector 35 controls the switching units 34a and 34b so that the selected A-phase coil and B-phase coil are the current supply destinations.

On the other hand, the stopping mode is applied when holding the substrate stage 14 in the predetermined positions as in step S11 of FIG. 3. The moving mode is changed to the stopping mode when it is determined that the substrate stage 14 is arranged in the predetermined position, based on the position of the substrate stage 14 measured by the measurement device 16.

The predetermined position is a position where the position of the substrate stage 14 can be held by turning on only one of the A-phase coil and the B-phase coil, that is, a position where the ratio of the current value of the A-phase coil to that of the B-phase coil is almost 100 to 0 or almost 0 to 100, and can be set in advance. The predetermined position is set as described above because, as will be described later, when the position of the substrate stage 14 is held by using both the A-phase coil and the B-phase coil, it is impossible to use one of them to generate heat without generating any thrust. In the example shown in FIG. 5, a position where the position of the substrate stage 14 can be held by turning on the B-phase coil B1 is set as the predetermined position. The predetermined position includes the positions of the substrate stage 14 when conveying the substrate W onto the substrate stage and when recovering the substrate from the substrate stage, and can also include a position where the substrate stage 14 is waiting when changing lots. That is, the predetermined position is not limited to one position, and can be set to a plurality of positions.

In the stopping mode, the selector 35 selects the B-phase coil B1 as the destination of current supply from the current driver 33b, and controls the switching unit 34b so as to switch the current supply destination to the B-phase coil B1. In this state, the current driver 33b outputs an electric current to be supplied to the B-phase coil B1, based on a command value determined by the position compensator 32 so that the substrate stage 14 holds the predetermined position. Also, as the destination of current supply from the current driver 33a, the selector 35 selects an A-phase coil arranged in a position where no thrust is given to the movable element 22, from the plurality of A-phase coils A1 to A3, and controls the switching unit 34a so as to switch the current supply destination to the selected A-phase coil. For example, the selector 35 can select, from the plurality of A-phase coils, an A-phase coil farthest from the substrate stage 14 (the movable element 22) stopped in the predetermined position, as a current supply destination. An A-phase coil to be selected as a current supply destination can also be set in advance for each predetermined position. In the example shown in FIG. 5, the A-phase coil A3 can be selected. In this case, the current driver 33a outputs an electric current to be supplied to the A-phase coil, based on a command value determined by the temperature compensator 36.

The temperature compensator 36 will be explained below. In the stopping mode, an electric current to be supplied to the coil 21a (the B-phase coil B1) so as to hold the position of the substrate stage 14 is very small (almost zero) compared to that in the moving mode. Therefore, the temperature compensator 36 estimates (calculates) the heat generation of the stator 21 in the moving mode, and determines a current command value to be supplied to the coil 21a, so that the heat generation of the stator 21 in the stopping mode approaches the estimated heat generation in the moving mode. For example, from an electric current i to be applied to the coil 21a and a resistance value R of the coil 21a when accelerating/decelerating the substrate stage 14 in a control period (moving period) in the moving mode, the temperature compensator 36 calculates the heat generation of the linear motor 20 by $i^2 \times R$. Then, average heat generation $i^2 \times R \times t$ of the linear motor in the moving period can be calculated by multiplying $i^2 \times R$ by ratio t % of the accelerating/decelerating time of the substrate stage 14 in the moving period (that is, the ratio of a time during which the coil 21a is actually turned on). The temperature compensator 36 determines a current command value to be supplied to the coil 21a, so that the coil 21a generates heat equivalent to the calculated average heat generation $i^2 \times R \times t$ even in the stopping mode.

As described above, the exposure apparatus 100 of this embodiment adopts the stage driving apparatus including the multi-phase excitation linear motor 20. In the stopping mode, the stage driving apparatus as described above holds the position of the substrate stage 14 in the predetermined position by turning on the first phase coil of the linear motor 20 (the stator 21), and turns on the second phase coil arranged in a position where no thrust is given to the movable element 22. This makes it possible to reduce the fluctuation of heat generation from the linear motor 20, and accurately form a pattern on a substrate. The stage driving apparatus of this embodiment is not limited to driving of the substrate stage 14, and is also applicable to driving of a stage on which an object is mounted, such as the mask stage 12.

Second Embodiment

The second embodiment according to the present invention will be explained. The second embodiment basically takes over the first embodiment, so differences from the first embodiment will be explained below.

When changing a control mode of a linear motor 20 between a moving mode and a stopping mode in a stage driving apparatus, it is necessary to synchronize the timing at which a switching unit 34a or 34b switches current supply destinations and the timing at which a current driver 33a or 33b switches current values. If these switching timings shift from each other, however, an overcurrent is applied to a coil 21a, a counter electromotive force is generated, and so on, and this sometimes makes it difficult to control the position of a substrate stage 14. In this embodiment, therefore, the control mode is changed between the moving mode and the stopping mode while interrupting current supply to a second phase coil to be used to generate heat without generating any thrust.

Figure 6:
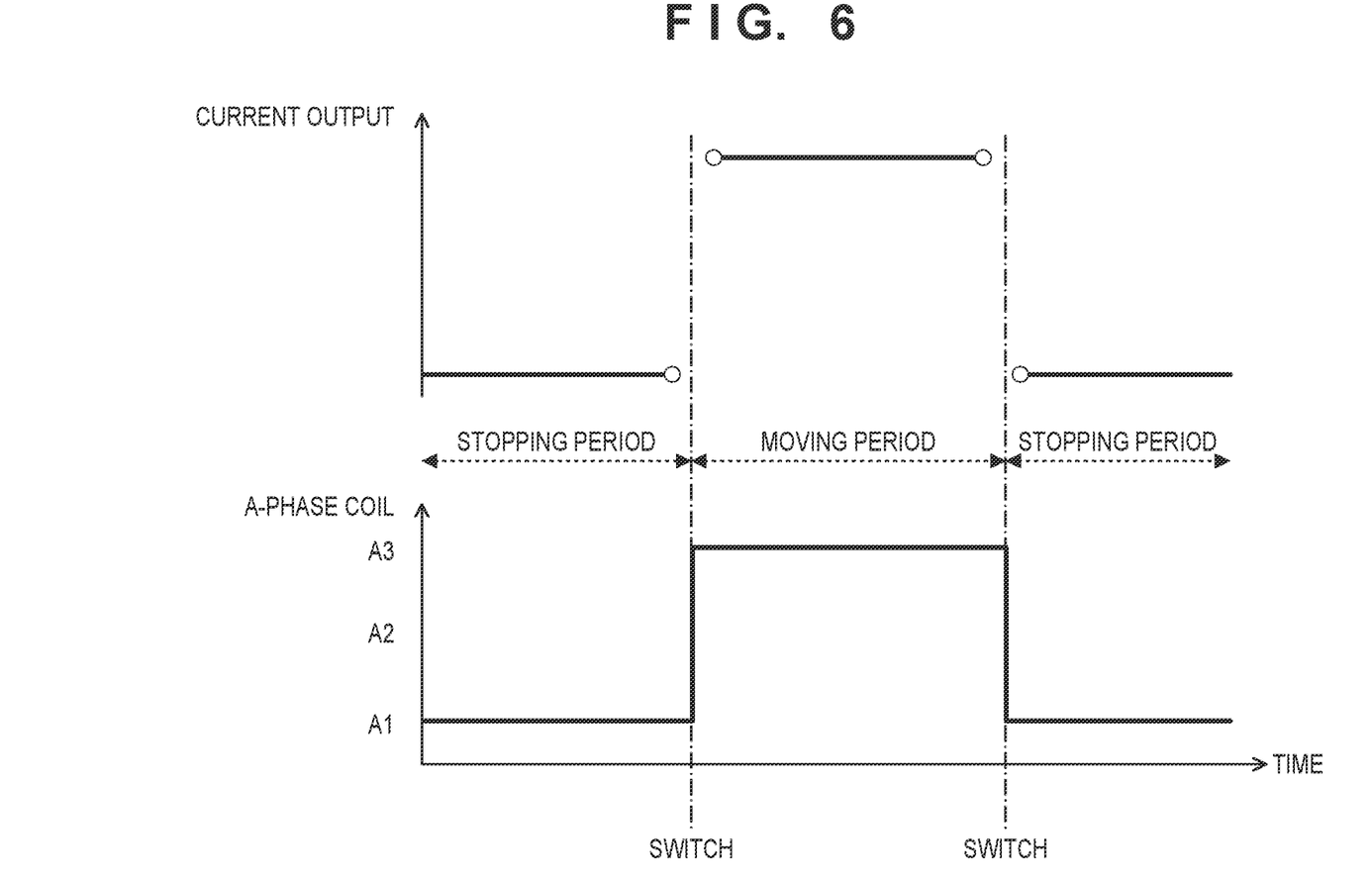
FIG. 6 is a timing chart showing the output timings of an electric current from a current driver and the switching timings in a switching unit.

FIG. 6 is a view showing the timing of current output from the current driver 33a or 33b and the switching timing of the switching unit 34a or 34b when switching the moving mode and the stopping mode. As shown in FIG. 6, when switching the moving mode to the stopping mode, current output from a current driver 33a based on a command value from a position compensator 32 is interrupted, and a switching unit 34a switches A-phase coils as current supply destinations from A1 to A3 in this state. Then, after the switching unit 34a switched the A-phase coils, the current driver 33a starts current output based on a command value from a temperature compensator 36. This applies to a case in which the stopping mode is switched to the moving mode. Control like this can prevent the application of an overcurrent to the coil 21a, the generation of a counter electromotive force, and the like when switching the modes.

Third Embodiment

Figure 7:
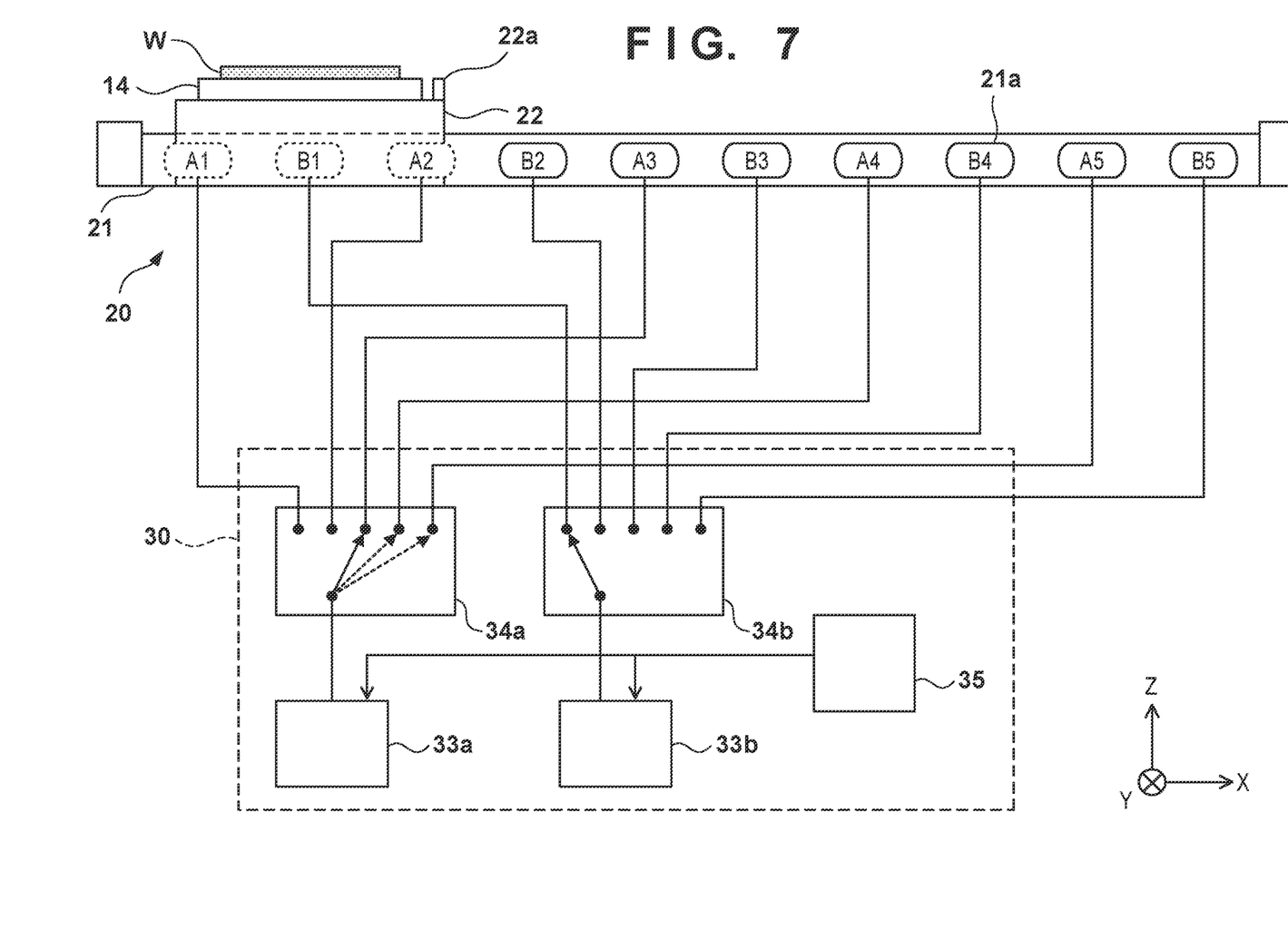
FIG. 7 is a view showing a configuration example of a stage driving apparatus of the third embodiment.

The third embodiment according to the present invention will be explained. The third embodiment basically takes over the first embodiment, so differences from the first embodiment will be explained below. FIG. 7 is a view showing a configuration example of a stage driving apparatus of the third embodiment. The differences of the stage driving apparatus of the third embodiment from the stage driving apparatus of the first embodiment shown in FIG. 5 are the arrangement of a stator 21 and the arrangement of switching units 34a and 34b. The stator 21 of this embodiment includes a plurality of A-phase coils A1 to A5 and a plurality of B-phase coils B1 to B5, and the switching units 34a and 34b are so configured as to correspond to the numbers of the A-phase coils and the B-phase coils. To simplify the drawing, FIG. 7 does not show a measurement device 16, a subtractor 31, a position compensator 32, and a temperature compensator 36.

When the stator 21 is spatially extended as shown in FIG. 7, it is preferable to dispersedly generate heat by a plurality of coils 21a, instead of generating heat by one coil 21a, from the viewpoint of the uniformity of a spatial heat distribution. In a stopping mode of this embodiment, therefore, a selector 35 selects the A-phase coils A3 to A5 arranged in positions where no thrust is given to a movable element 22, from the plurality of A-phase coils A1 to A5, as the destinations of current supply from a current driver 33a. When the plurality of A-phase coils A3 to A5 arranged in the positions where no thrust is given to the movable element 22 exist as described above, the selector 35 controls the switching unit 34a so as to temporally (for every predetermined time) switch the A-phase coils to which the current driver 33a supplies an electric current. In this state, the current driver 33a outputs an electric current to be supplied to the A-phase coil based on a command value determined by the temperature compensator 36.

Fourth Embodiment

The fourth embodiment according to the present invention will be explained. The fourth embodiment basically takes over the first embodiment. In this embodiment, the setting of a predetermined position where a linear motor 20 is operated in a stopping mode will be explained with reference to FIG. 8.

Figure 8:
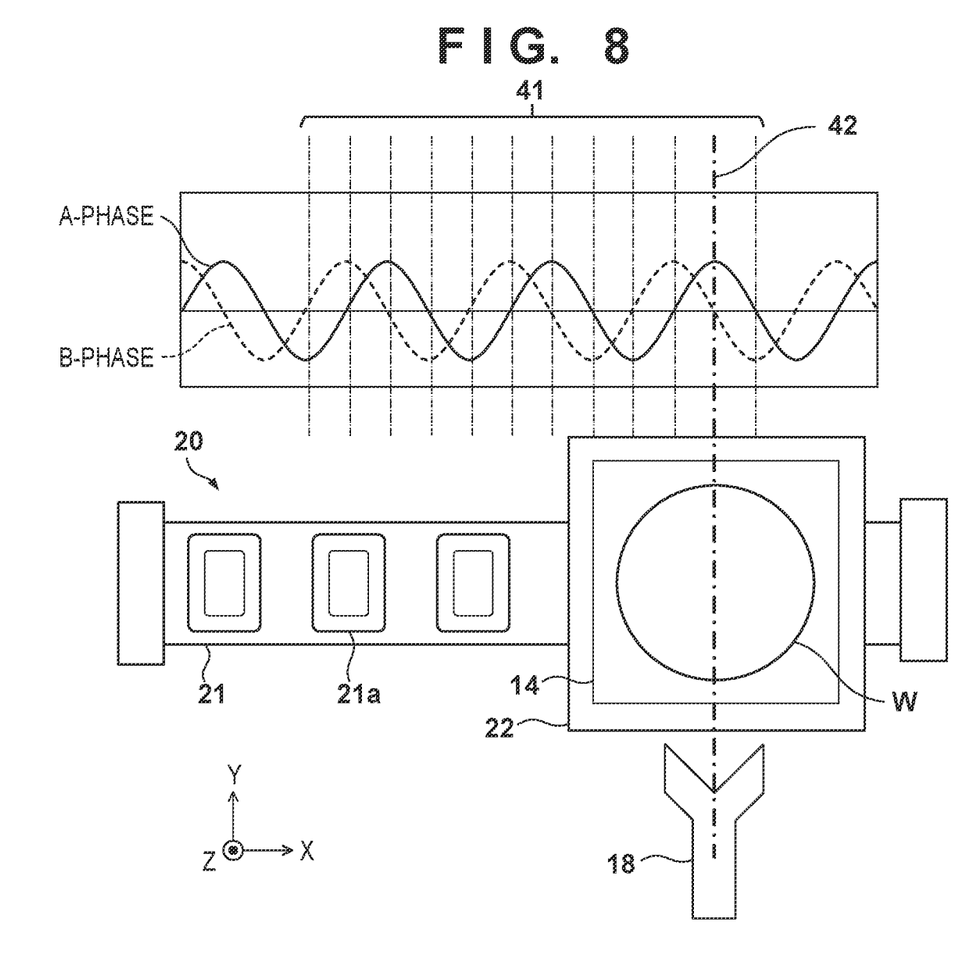
FIG. 8 is a view showing a predetermined position setting example.

FIG. 8 is a view showing a setting example of the predetermined position. For example, as shown in FIG. 8, the position of a substrate stage 14 when conveying a substrate W by using a substrate conveying mechanism 18 (a robot) can be selected from a plurality of position candidates 41 in which the ratio of the current value of an A-phase coil to that of a B-phase coil is almost 100 to 0 or almost 0 to 100. In this example shown in FIG. 8, the predetermined position can be set in a position suitable for the substrate conveying mechanism 18 to convey the substrate W onto the substrate stage 14, for example, a position 42 where the time required for the substrate conveying mechanism 18 to convey the substrate W is shortened most, among the plurality of position candidates 41.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a substrate by using the above-mentioned lithography apparatus (exposure apparatus), and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-049909 filed on Mar. 16, 2018, which is hereby incorporated by reference herein in its entirety.

What is claimed is:

1. A stage driving apparatus for driving a stage, comprising:
   a linear motor including a stator which includes a coil array obtained by alternately arraying first phase coils and second phase coils, and a movable element placed on the stage; and
   a control unit configured to control the linear motor by controlling an energization state of the coil array,
   wherein in a stopping period during which the stage is stopped in a predetermined position, the control unit holds a position of the stage in the predetermined position by turning on the first phase coil among the coil array, and generates heat by turning on the second phase coil arranged in a position where no thrust is given to the movable element among the coil array.

2. The apparatus according to claim 1, wherein the predetermined position is a position where the position of the stage can be held by only the first phase coil, without using any second phase coil.

3. The apparatus according to claim 2, wherein the predetermined position is a position where the position of the stage can be held by only one first phase coil among the coil array.

4. The apparatus according to claim 1, wherein the predetermined position includes at least one of a position where an object is conveyed onto the stage, and a position where an object is recovered from the stage.

5. The apparatus according to claim 1, wherein in the stopping period, the control unit determines a second phase coil farthest from the movable element among the coil array, as a second phase coil to be turned on.

6. The apparatus according to claim 1, wherein in the stopping period, in a case where a plurality of second phase coils arranged in positions where no thrust is given to the movable element exist, the control unit temporally switches a second phase coil to be turned on among the plurality of second phase coils.

7. The apparatus according to claim 1, wherein the control unit determines a current value to be supplied to the second phase coil in the stopping period such that heat generation of the second phase coil approaches heat generation of the stator in a moving period during which the stage is moved.

8. The apparatus according to claim 1, wherein
   the control unit includes a first mode and a second mode as control modes of the linear motor,
   the first mode is a mode for holding the position of the stage by turning on the first phase coil, and generating heat by turning on the second phase coil arranged in a position where no thrust is given to the movable element, and
   the second mode is a mode for controlling the position of the stage by switching, among the coil array, pairs of the first phase coils and the second phase coils to be turned on to give thrust to the movable element.

9. The apparatus according to claim 8, wherein the control unit switches the first mode and the second mode in a state in which current supply to the second phase coil is interrupted.

10. The apparatus according to claim 1, wherein an electric current to be supplied to the first phase coil and an electric current to be supplied to the second phase coil have a phase angle difference of 90°.

11. A lithography apparatus for forming a pattern on a substrate, comprising:
    a stage configured to hold the substrate; and
    a stage driving apparatus configured to drive the stage,
    wherein the stage driving apparatus includes:
       a linear motor including a stator which includes a coil array obtained by alternately arraying first phase coils and second phase coils, and a movable element placed on the stage; and
       a control unit configured to control the linear motor by controlling an energization state of the coil array, and
    wherein in a stopping period during which the stage is stopped in a predetermined position, the control unit holds a position of the stage in the predetermined position by turning on the first phase coil among the coil array, and generates heat by turning on the second phase coil arranged in a position where no thrust is given to the movable element among the coil array.

12. A method of manufacturing an article, the method comprising:
    forming a pattern on a substrate using a lithography apparatus;
    processing the substrate, on which the pattern has been formed, to manufacture the article,
    wherein the lithography apparatus includes:
       a stage configured to hold the substrate; and
       a stage driving apparatus configured to drive the stage,
    wherein the stage driving apparatus includes:
       a linear motor including a stator which includes a coil array obtained by alternately arraying first phase coils and second phase coils, and a movable element placed on the stage; and
       a control unit configured to control the linear motor by controlling an energization state of the coil array, and
    wherein in a stopping period during which the stage is stopped in a predetermined position, the control unit holds a position of the stage in the predetermined position by turning on the first phase coil among the coil array, and generates heat by turning on the second phase coil arranged in a position where no thrust is given to the movable element among the coil array.

* * * * *